(12) United States Patent
Forrest et al.

(10) Patent No.: US 7,786,427 B2
(45) Date of Patent: Aug. 31, 2010

(54) PROXIMITY OPTICAL MEMORY MODULE HAVING AN ELECTRICAL-TO-OPTICAL AND OPTICAL-TO-ELECTRICAL CONVERTER

(75) Inventors: Craig S. Forrest, San Francisco, CA (US); Robert J. Drost, Los Altos, CA (US); Ronald Ho, Mountain View, CA (US); Ivan E. Sutherland, Santa Monica, CA (US)

(73) Assignee: Oracle America, Inc., Redwood Shores, CA (US)

( * ) Notice: Subject to any disclaimer, the term of this patent is extended or adjusted under 35 U.S.C. 154(b) by 308 days.

(21) Appl. No.: 12/115,989

(22) Filed: May 6, 2008

(65) Prior Publication Data

US 2009/0279341 A1 Nov. 12, 2009

(51) Int. Cl.
*G01J 1/04* (2006.01)
(52) U.S. Cl. .................. 250/227.11; 250/551
(58) Field of Classification Search ............ 250/227.11, 250/227.24, 551, 214 R; 711/118–129; 365/63, 365/64, 189.05; 385/14, 15, 39
See application file for complete search history.

(56) References Cited

U.S. PATENT DOCUMENTS 6,651,139 B1 * 11/2003 Ozeki et al. ................ 711/118

2008/0077731 A1 3/2008 Forrest

FOREIGN PATENT DOCUMENTS

EP 1587141 A2 10/2005
EP 1587141 A3 12/2007

OTHER PUBLICATIONS

Drost, Robert et al., "Challenges in Building a Flat-Bandwidth Memory Hierarchy for a Large-Scale Computer with Proximity Communications", IEEE Computer Society, Proceedings of the 13th Symposium on High Performance Interconnects (HOTI'05).

* cited by examiner

*Primary Examiner*—Que T Le
(74) *Attorney, Agent, or Firm*—Park, Vaughan & Fleming LLP

(57) ABSTRACT

A memory module is formed of multiple memory chips and an optical interface chip fixed on a substrate. The chips are interconnected by proximity communication (PxC) in which each chip includes transmitting and receiving elements, such as electrical pads which form capacitively coupled links when the chips are placed together with their pads facing each other. The PxC links may be directly between the chips or through an intermediate passive bridge chip. The interface chip is coupled to an external optical channel and includes converters between optical and electrical signals, control circuitry, buffers, and PxC elements for communicating with the memory chips. The array of memories may be a linear or two-dimensional array around the interface chip forming a redundant PxC network, optionally with redundant PxC connections. Multiple rectangular memory chips may present their narrow sides to the interface chip to maximize bandwidth.

14 Claims, 10 Drawing Sheets

PROXIMITY OPTICAL MEMORY MODULE HAVING AN ELECTRICAL-TO-OPTICAL AND OPTICAL-TO-ELECTRICAL CONVERTER

BACKGROUND

1. Field

The invention relates generally to the integration of multiple integrated circuit memory chips combined into a memory module. In particular, the invention relates to a memory module including memory chips, an optical interface, and a proximity communication system linking them.

2. Related Art

Computer systems today suffer from a disparity between processing power and bandwidth to memory. On-chip processing performance has improved by about 40% per year over the past two decades due to increased transistor counts and speeds enabled by lithographic scaling of transistor dimensions. In contrast, off-chip bandwidth to main memory has increased much more slowly, at about 10% per year over this timeframe, due to limited improvements in package pin count, board wiring density, and channel speeds. The technical challenge to reducing this gap in performance lies in increasing the bandwidth to main memory.

This problem exists in general for all high performance computer systems, but the problem is acute in multi-core processors. In these processors, a single chip executes tens of software threads simultaneously. Bandwidth improvements are critical to prevent these threads from having to wait on memory accesses from the different threads. In addition, multi-core processors require a much larger memory space than single-core processors to support simultaneous execution of many independent threads. Existing memory modules present challenges in scaling to hundreds of gigabytes of memory due to difficulties in interfacing the memory modules to a memory controller.

Existing memory module technologies, such as double-data-rate-2 (DDR2) or double date rate-3 (DDR3) dual in-line memory modules (DIMMs), typically include a memory interface chip and multiple memory chips, usually dynamic random access memories (DRAMs), mounted on a small printed circuit board including electrical interconnections formed in the board. Such modules, however, are limited by the number of wiring channels and connectors, power, and bandwidth in the printed circuit boards.

Technologies that overlay serial links on these channels, such as fully buffered DIMMs (FBDIMMs) and Rambus memory modules, improve electrical signaling performance per channel, but are still limited by board or cable wiring channels, and by electrical tradeoffs in bandwidth versus power and bandwidth versus distance. It is possible in an optical fully buffered module to replace the electrical interface with an optical interface between the memory controller and the memory modules. Optical communication provides welcome improvement in power and bandwidth metrics for this interface but can easily exceed the I/O bandwidths of memory chips in the module limited by conventional pin-oriented connections.

The bandwidth of conventional designs of memory modules is limited by a number of factors. For example, the number of parallel electrical interconnects, that is, the bus width, in the printed circuit board between the interface and the multiple memory chips is limited by the pitch of parallel connectors in the lines, currently limited to a pitch of 140 to 190 microns. The limited number of interconnections has prompted the design of a typical DRAM chip to include a single I/O port for multiple memory banks on the chip, only one of which can be accessed during a memory cycle.

Accordingly, it is desired to match the internal bandwidth of the memory module with the large external bandwidth provided by optical channels.

SUMMARY

Some embodiments of the present invention provide a multi-chip memory system that includes an interface chip with an optical I/O port and electronic memory chips interconnected by proximity communication including paired transmitting and receiving elements formed on the chips and communicating between them when the chips are stacked together. The interface chip translates between external optical channels and the internal proximity communication system. The interface chip may be connected to one or more external optical fibers or other optical channels and include optical-to-electrical and electrical-to-optical converters.

In some embodiments, the interface chip may also include electronic buffers for both input and output.

In some embodiments, the transmitting and receiving elements are metal pads formed on the surfaces of the chips and which form capacitors when the chips are assembled with an intervening dielectric layer.

In some embodiments, all of the chips are placed on a substrate and bridge chips are placed over and between neighboring ones of the chips to form a proximity communication system between the active chips and the bridge chip. The bridge chips may be passive and only act as communication paths.

In other embodiments, some chips with their capacitive pads facing upward are placed on the substrate and other chips with their capacitive pads facing downward are placed on and between neighboring ones of the upwardly facing chips to act as active bridge chips and form a proximity communication system between the chips.

In some embodiments, the interface chip and the memory chips are formed in a linear array of plural memory chips arranged on each of two opposed sides of the interface chip and interconnected through a proximity communication system.

In one embodiment, memory chips are placed on each of the four sides of an interface chip and coupled to it by respective proximity communication channels.

In other embodiments, the memory chips are arranged in a two-dimensional array around the interface chip and are connected by a proximity communication network to each other and to four sides of the interface chip. The proximity communication network may include links to one, two, three or four sides of the memory chip to form a redundant network.

In a further embodiment, plural interface chips are placed on the substrate within a two-dimensional array of memory chips forming a redundant proximity communication network.

In some embodiments, plural memory chips are placed on each of one or more sides of the interface chip and connected to it through respective proximity communication channels.

In a further embodiment, plural memory chips connected to a side of the interface chip have a high-aspect ratio rectangular shape with their narrow sides facing and connected to the interface chip through respective proximity communication channels.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

According to one embodiment of the invention, a proximity optical memory module (POMM) combines the two high bandwidth communication technologies of Proximity Communication and optical communication channels together with memory chips in a single module that offers improved bandwidth, power, cost, and capacity.

Proximity Communication (PxC) is a recently developed technology in which two integrated circuit chips are coupled together by a wireless channel including metal plates formed on the principal, generally planar surfaces of each of the chips. Assembling the chips to juxtapose the plates to form a capacitor between them provides a capacitive communication link between the assembled chips without the need for additional wiring. Drost et al. describe Proximity Communication systems in "Proximity Communication," *IEEE Journal of Solid-State Circuits*, vol. 39, no. 9, pp. 1529-1536, September 2004. Such links can be formed in dense two-dimensional arrays with plate pitches as low as 15 to 20 microns. Proximity Communication refers to data transmission between chips placed near to each other. While this discussion focuses on capacitive coupling, proximity communication can employ inductive, optical or conductive coupling as well.

Optical fiber communication links are known to provide high-speed data buses in computer systems.

Adding Proximity Communication to memory chips offers other advantages as well. First, it lowers the power consumption per I/O channel. Second, it potentially offers a more economical and more reliable packaging method versus wire bonding or flip-chip ball bonding. Third, Proximity Communication provides a large number of I/O channels that can be run at lower speeds that are easily achieved by the transistors and metallization available in a memory technology.

Figure 1:
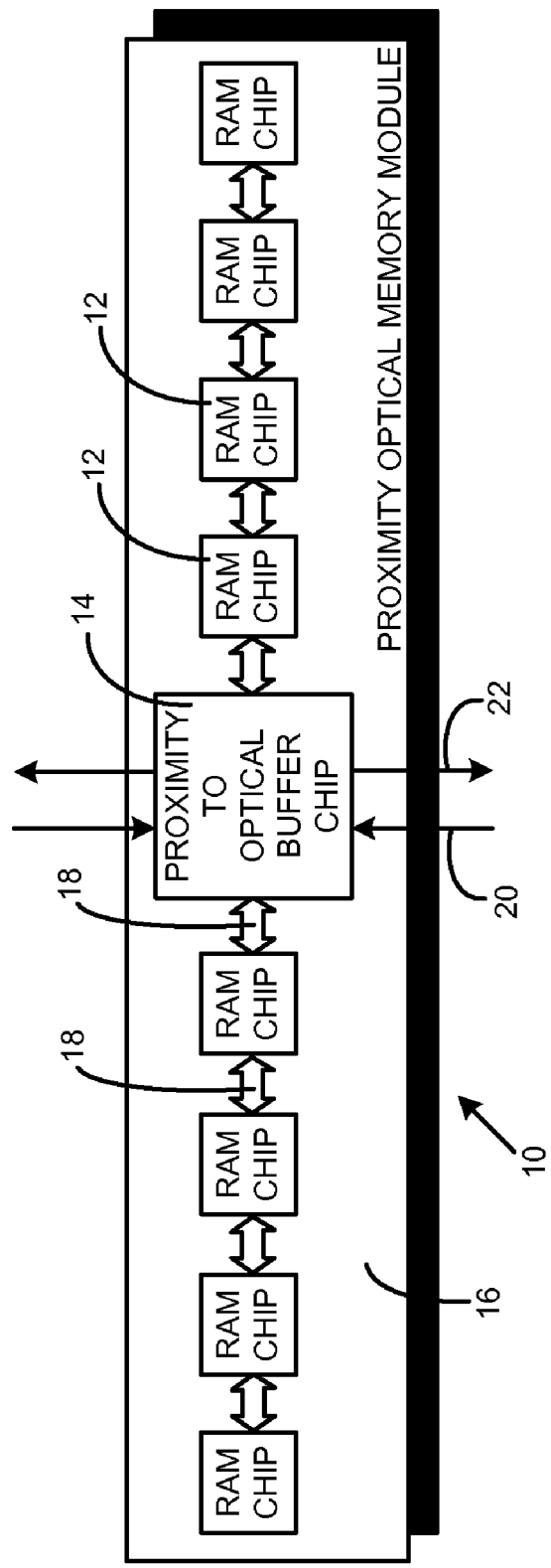
FIG. 1 is a plan circuit diagram of a linear proximity-to-optical memory module in accordance with an embodiment of the present invention.

One embodiment of a proximity optical memory module 10 is illustrated in the circuit diagram of FIG. 1. It includes a linear vector of memory chips 12 and one proximity-to-optical buffer chip 14, also called the interface chip, mounted on a principal surface of a substrate 16. The substrate 16 may be a board resembling the printed circuit board of a DIMM memory module. The memory chips 12 are semiconductor electronic integrated circuits, typically formed of silicon. A dynamic random access memory (DRAM) is one example of a widely used memory chip but the invention applies to other forms and designs of memory chips.

The chips 12, 14 communicate across adjacent edges using Proximity Communication (PxC) links 18. On the other hand, the proximity-to-optical buffer chip 14 communicates with the computer system controller and with other memory modules over one or more pairs of optical channels 20, 22.

Figure 2:
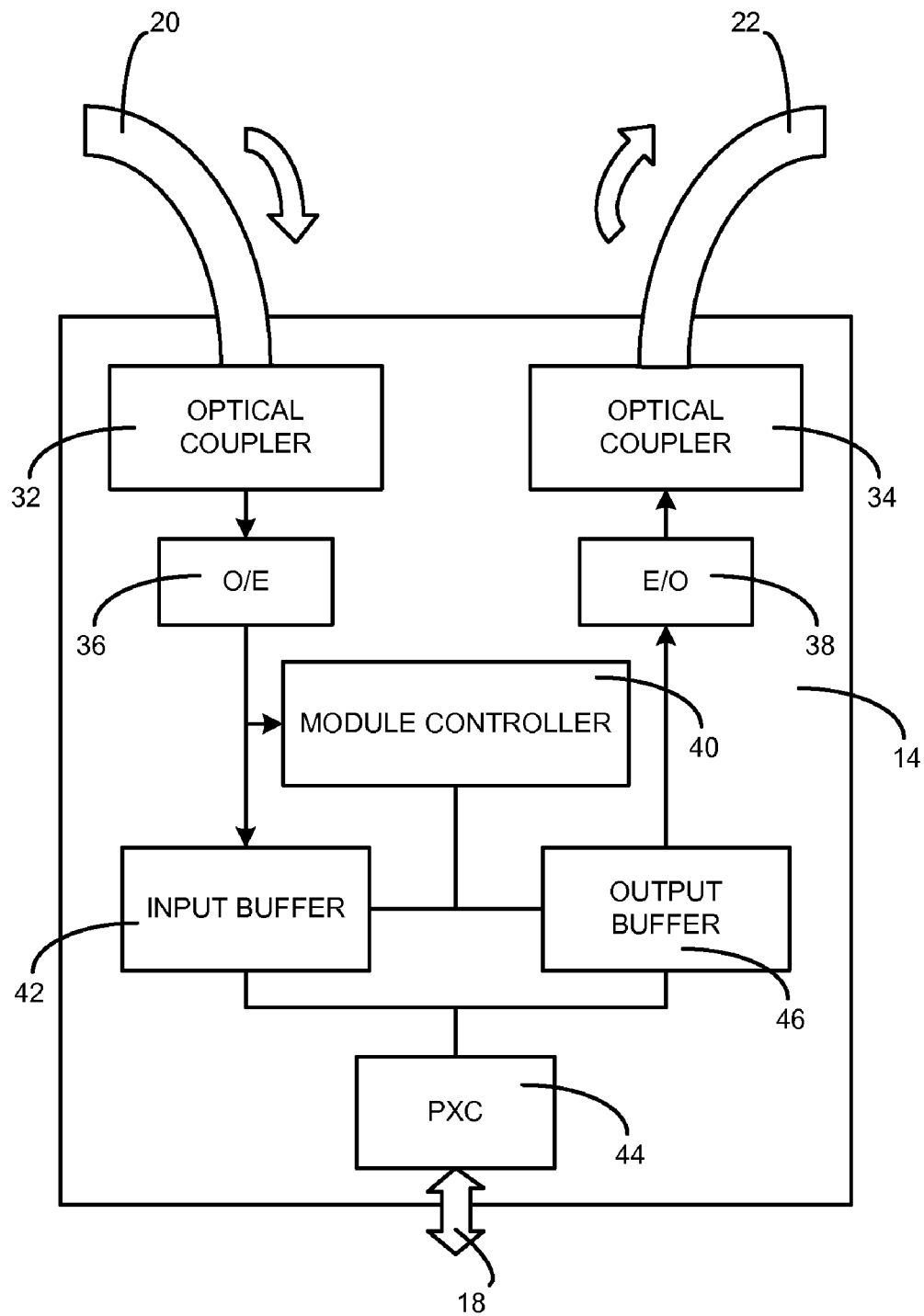
FIG. 2 is a circuit diagram of a proximity-to-optical buffer chip including optical cabling in accordance with an embodiment of the present invention.

The interface chip 14 may perform a number of functions, as illustrated in the schematic diagram of FIG. 2. Two optical channels 20, 22 are bonded or otherwise coupled to the interface chip 14 to overlie two optical couplers 32, 34 formed in the chip, for example, diffraction gratings coupled to optical waveguides in the interface chip 14. An optical-to-electrical converter 36 converts the optical signal received from the memory controller to electrical form while an electrical-to-optical converter 38 converts an electrical signal to be transmitted to the memory controller to optical form. A module controller 40 communicates with the memory system controller and controls the operation of the memory module 10. An input buffer 42 is a relatively large electronic memory to temporarily store received signals and act as a buffer between the data signals from the memory system controller and the memory chips. Under control of the module controller 40, data signals to be stored are output from the input buffer 42 to the memory chips 12 through a proximity communication area 44, for example an array of metal plates or pads forming half of the capacitors of a capacitively coupled PxC link 18. Similarly, an output buffer 46 receives data from the memory chips 12 through the proximity communication area 44 and buffers the data for output to the memory system controller.

Figure 3:
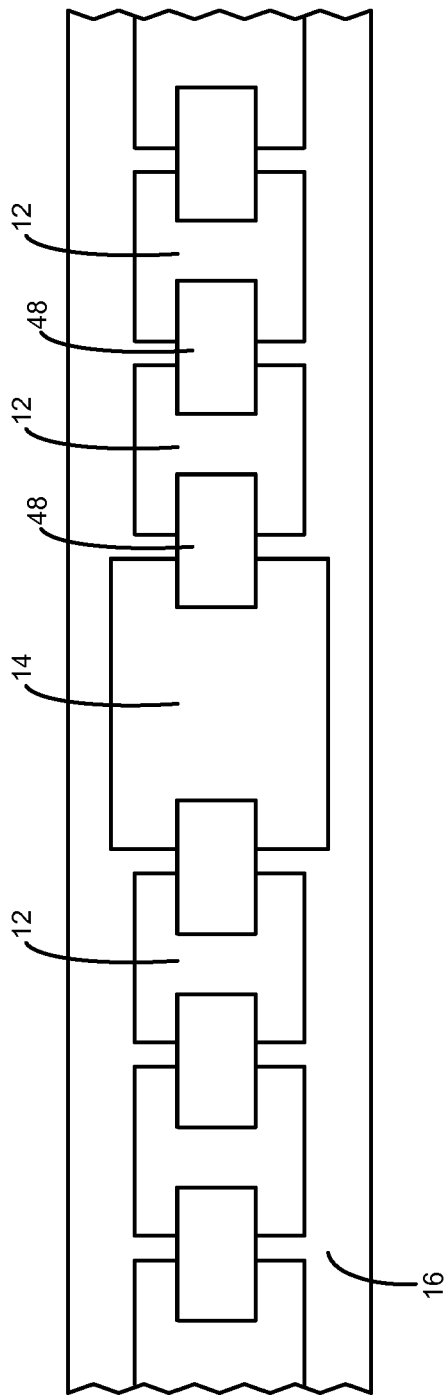
FIG. 3 is a plan view of a physical embodiment of the proximity-to-optical memory module of FIG. 1.
Figure 4:
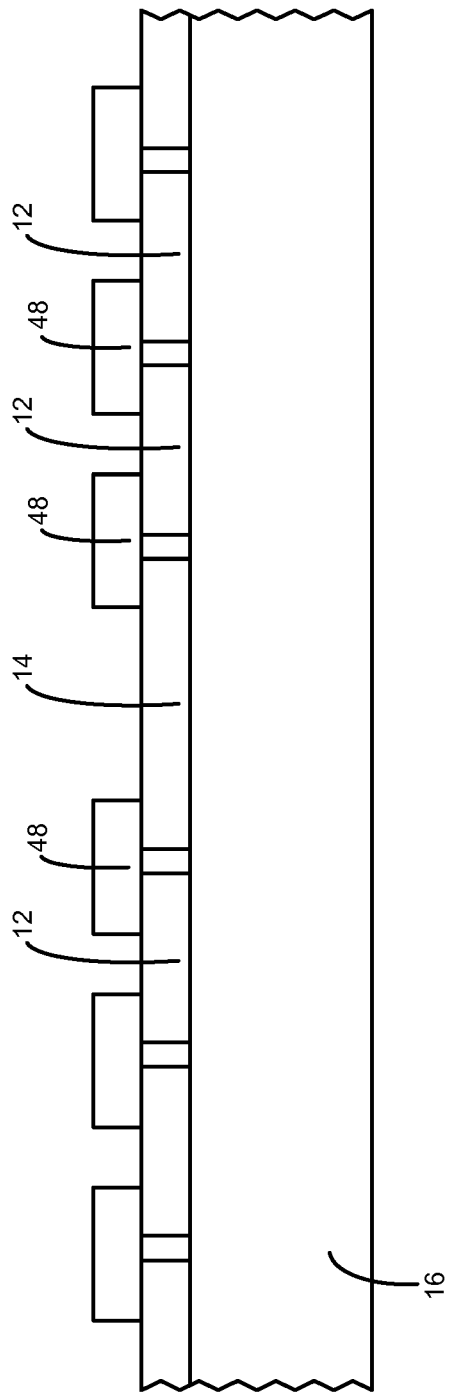
FIG. 4 is a cross-sectional view of the physical embodiment of FIG. 3.

One physical embodiment of the memory module 10 is illustrated in the plan view of FIG. 3 and the cross-sectional view of FIG. 4. The memory chips 12 and the proximity-to-optical buffer chip 14 are fixed to the substrate 16 with the PxC pads formed in their principal surfaces oriented upward. Bridge chips 48 are fixed to adjacent pairs of the chips 12, 14 with the PxC pads on the principal surfaces at opposed ends of the bridge chips 48 oriented downward and facing those of the neighboring two of the chips 12, 14. In one implementation, the bridge chips 48 are passive and contain only metal wiring structures and thus provide only electrical interconnects between the active chips 12, 14. However, if desired, active circuits may be formed in the bridge chips 48.

The bridge chips 48 may thus provide a dense set of interconnections including intermediate connections through the memory chips 12 to thus connect the proximity-to-optical buffer chip 14 to all the memory chips 12.

Figure 5:
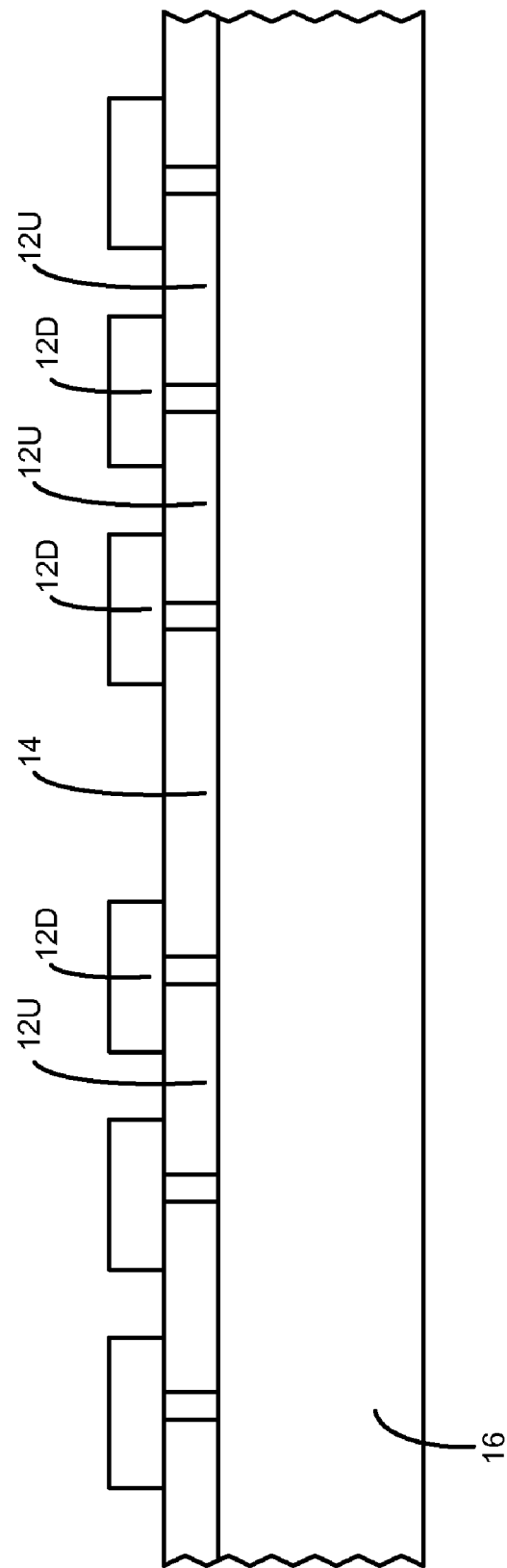
FIG. 5 is a plan view of another physical embodiment of the proximity-to-optical memory module of FIG. 1.

In another physical embodiment illustrated in the cross-sectional view of FIG. 5, the proximity-to-optical buffer chip 14 and upward facing memory chips $12_U$ are fixed to the substrate 16 with their PxC pads facing upward. Downward facing memory chips $12_D$ with their PxC pads facing downward are fixed to neighboring ones of the proximity-to-optical buffer chip 14 and the upward facing memory chips $12_U$ to serve not only as memories but also as bridge chips.

Figure 6:
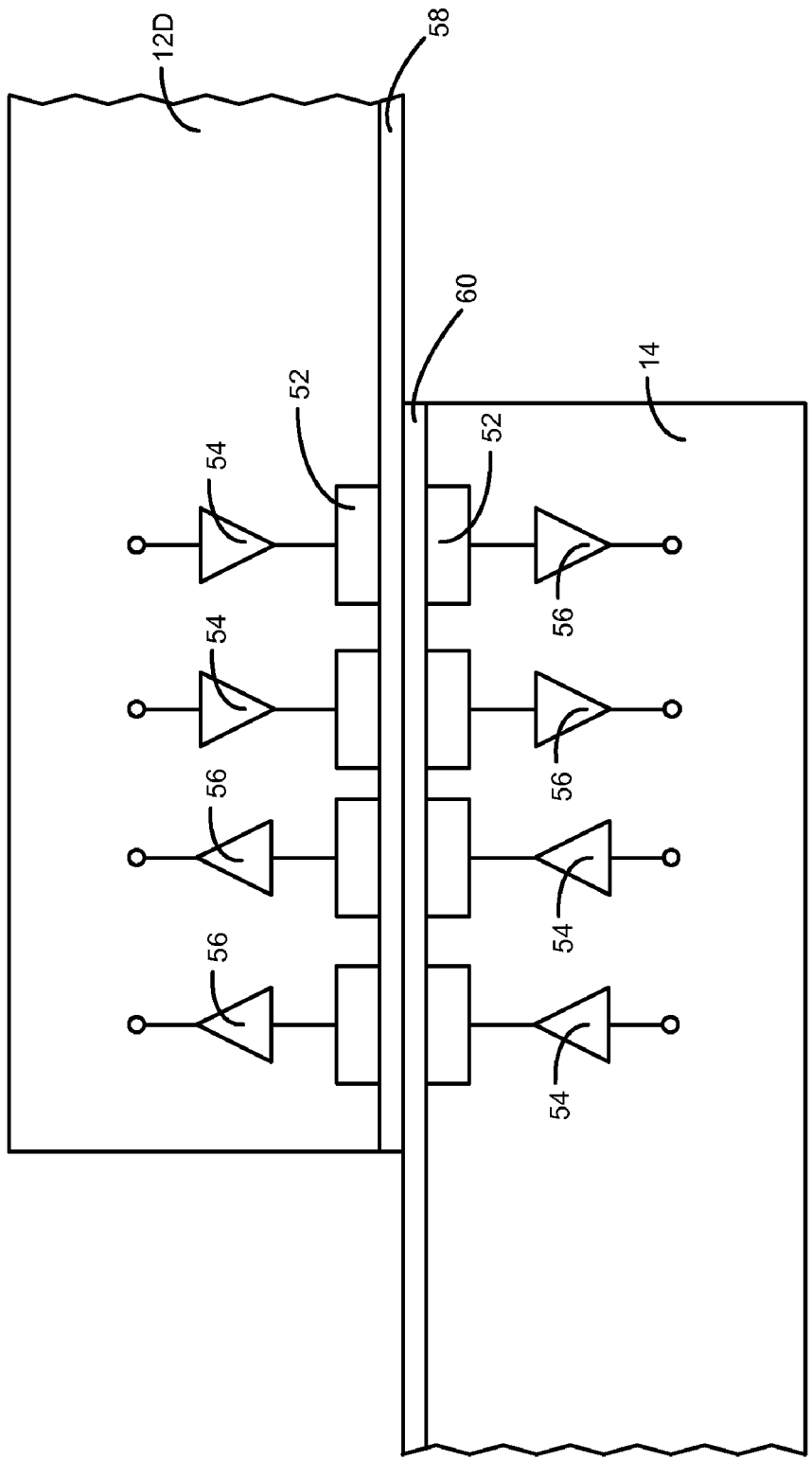
FIG. 6 is a cross-sectional view of a physical implementation of a proximity-to-optical communication link between two chips.

An exemplary structure for the PxC communication link connecting the interface chip 14 to the adjacent downwardly facing memory chip $12_D$ is illustrated in the cross-sectional view of FIG. 6. Each chip $12_D$, 14 has formed near one of its principal surfaces an array of pads 52. Some of the pads 52 are driven by drivers 54 to transmit signals from those pads 52 while other pads 52 are connected to receivers 56 to receive and amplify signals received on those pads 52. The drivers 54 and receivers 56 form part of the electronic integrated circuits formed in the chips $12_D$, 14. Thin dielectric layer 58, 60, for example, passivation layers are formed on the surfaces of the respective chips $12_D$, 14 and overlie the pads 52. The chips $12_D$, 14 are fixed together, for example, in a mechanical jig, with the pads 52 of the underlying interface chip 14 aligned with the pads of the overlying downward facing memory chip $12_D$. Drost et al. describe several chip assembly methods in US patent application publication 2006/0017147. The opposed pads 52 form respective capacitors across the intervening dielectric layers 58, 60. These capacitors enable capacitively coupled communication paths, or PxC channels, between the two chips $12_D$, 14. Ultimately, some of the PxC channels are used as input channels to memory locations and their control circuitry while other PxC channels as used as output channels from the memory locations.

Similar structures may be formed for the PxC link between upward and downward facing memory chips $12_U$, $12_D$ of FIG. 5. A PxC link between an active chip and the bridge chip 48 of FIGS. 3 and 4 does not necessarily require amplifiers and receivers in the bridge chip 48. Also, if a channel passes through a memory chip 12 as an intermediary chip, amplifiers and receivers can also be omitted for those channels, which then become passive channels in the intermediary chip. Further, PxC channels passing through an intermediary memory chip 12 do not need to pass through the one or more memory I/O ports used to access the memory locations on that chip. Instead, the pass-through channels may be directly connected between the input pads and output pads on the intermediary memory chip with possible amplifiers in between.

Figure 7:
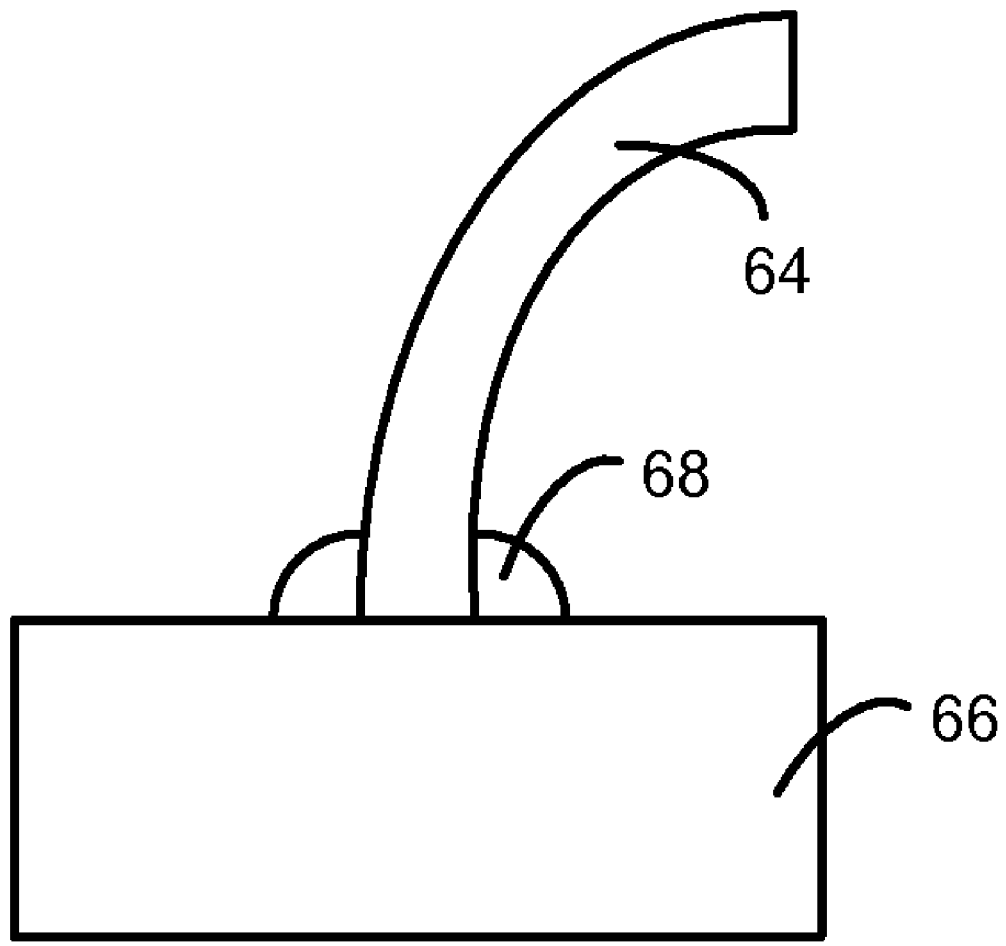
FIG. 7 is a cross-sectional view of an embodiment of an optical cabling chip usable with an embodiment of the present invention.

An optical channel can be advantageously connected to the memory modules as illustrated in the cross-sectional view of FIG. 7. One or more optical channels 64 are connected to the top surface of an optical cabling chip 66. In an exemplary physical embodiment, the optical channels 64 may be optical fibers, which are connected to the chip 66 with a bead 68 of epoxy. The optical cabling chip 66 may include any required optical coupler and optical-to-electrical (O/E) or electrical-to-optical (E/O) converters. The bottom surface of the optical cabling chip 66 includes PxC pads so that, when it is juxtaposed to the optical-to-proximity buffer chip 14 with similarly arranged pads, a PxC communication link is formed between them. This design envisions that the proximity-to-optical buffer chip 14 of FIG. 1 does not include the optical couplers 32, 34 or the O/E or E/O converters 36, 38 of FIG. 2.

Alternatively, the optical cabling chip 66 with upwardly facing PxC pads may be mounted directly on the substrate 16 and be connected by PxC communication links through an intermediary chip to the proximity-to-optical buffer chip 14.

In one possible specific implementation, a 1 terabit per second (1e12 bits per second) optical interface 14 communicates with 16 memory chips 12, each of which contains 8 memory banks with a 128-bit bank width and a column address sense (CAS) cycle time of 10 ns. Normally the aggregate bandwidth would be 16 memorychips 128 bits/10 ns=200 Gbps, but given the bandwidth and I/O afforded by PxC, which provides sufficient data paths to separately link to multiple I/O ports interfacing to different ones of the memory banks, it becomes possible to simultaneously communicate with all banks on each chip, thus avoiding the necessity of multiplexing them to a single I/O port on each memory chip 12. This enables a peak memory bandwidth of 1.6 Tbps which is well served by the peak bandwidths of 1 Tbps for the optical channels 20, 22 and 2 Tbps for the proximity communication links 18. In this arrangement, the memory chips have proximity interfaces along one or two opposing chip edges. The bandwidth, banking, and memory cycle time parameters of this exemplary configuration are listed for illustrative purposes only and do not limit the invention. Many other performance, cost, and manufacturability tradeoffs can be achieved by variations of one or more of these parameters.

Figure 8:
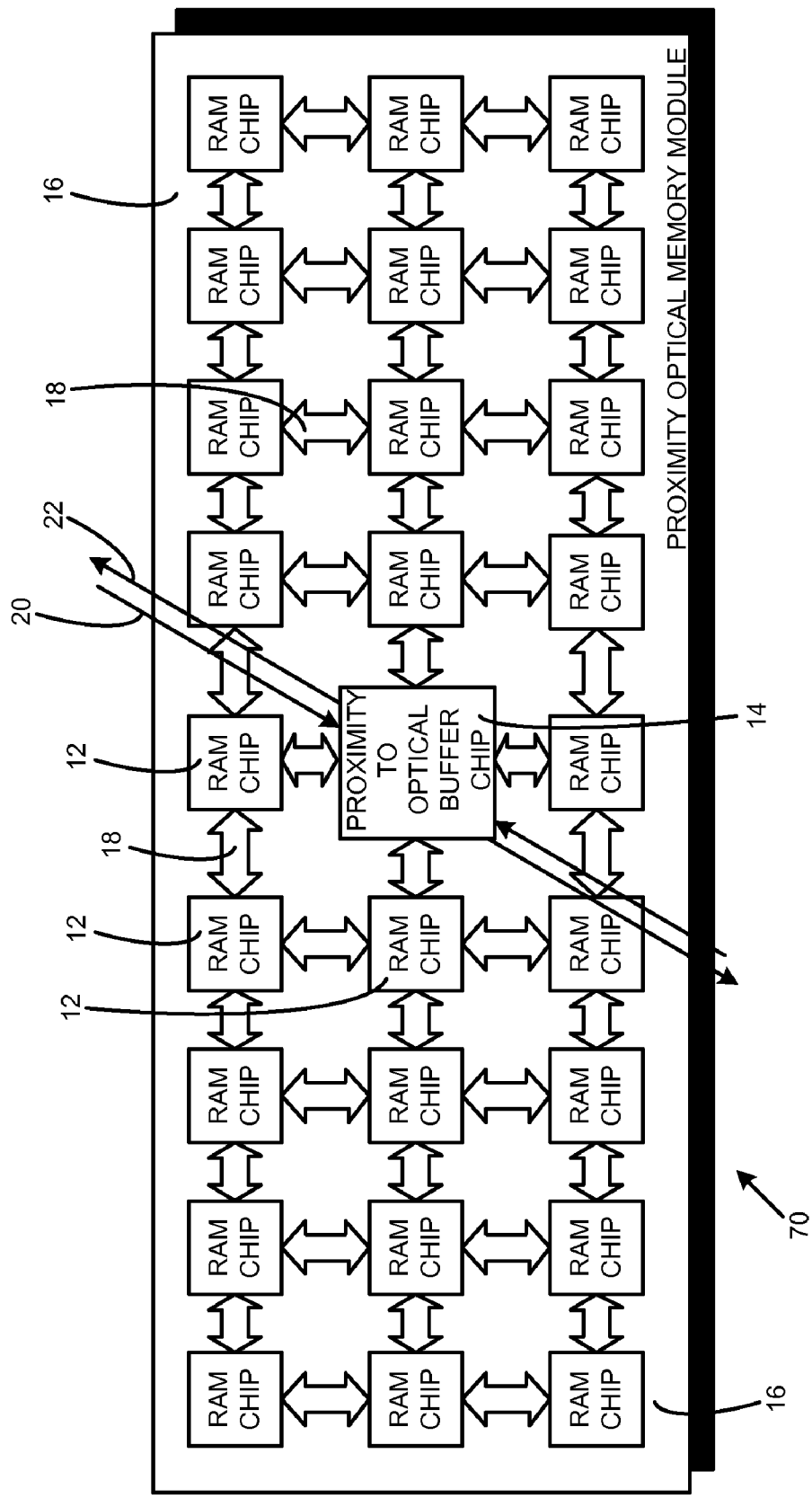
FIG. 8 is a plan circuit diagram of a two-dimensional proximity-to-optical memory module in accordance with an embodiment of the present invention.

The linear arrangement of FIG. 1 may become physically difficult or expensive to package for a large number of memory chips. A larger set of memory chips may be enabled if, for instance, the bandwidth provided by optical and proximity interfaces outstrips that of the memory banks, or if one requires a larger capacity per memory module. A two-dimensional proximity optical memory module 70, illustrated in the plan view of FIG. 8, includes one proximity-to-optical buffer chip 14, preferably centrally located on the substrate 16, and multiple memory chips 12 arranged around it in a two-dimensional array linked together by PxC links 18 between neighboring ones of the interface chip 14 and the memory chips 12. The form of the PxC communication links 18 is freely chosen and may follow that of FIG. 3 or 5. In this embodiment, the interface chip 14 is connected along its four edges with four PxC communication links 18 and many of the memory chips 18 are connected to four of its neighbors with four proximity communication links 18. The number of communication links 18 is larger than necessary for connectivity but the numerous communication links 18 are advantageous because they provide alternate paths between the interface chip 14 and any memory chip 12, thus providing redundancy and tolerance to defects and isolated failures.

Figure 9:
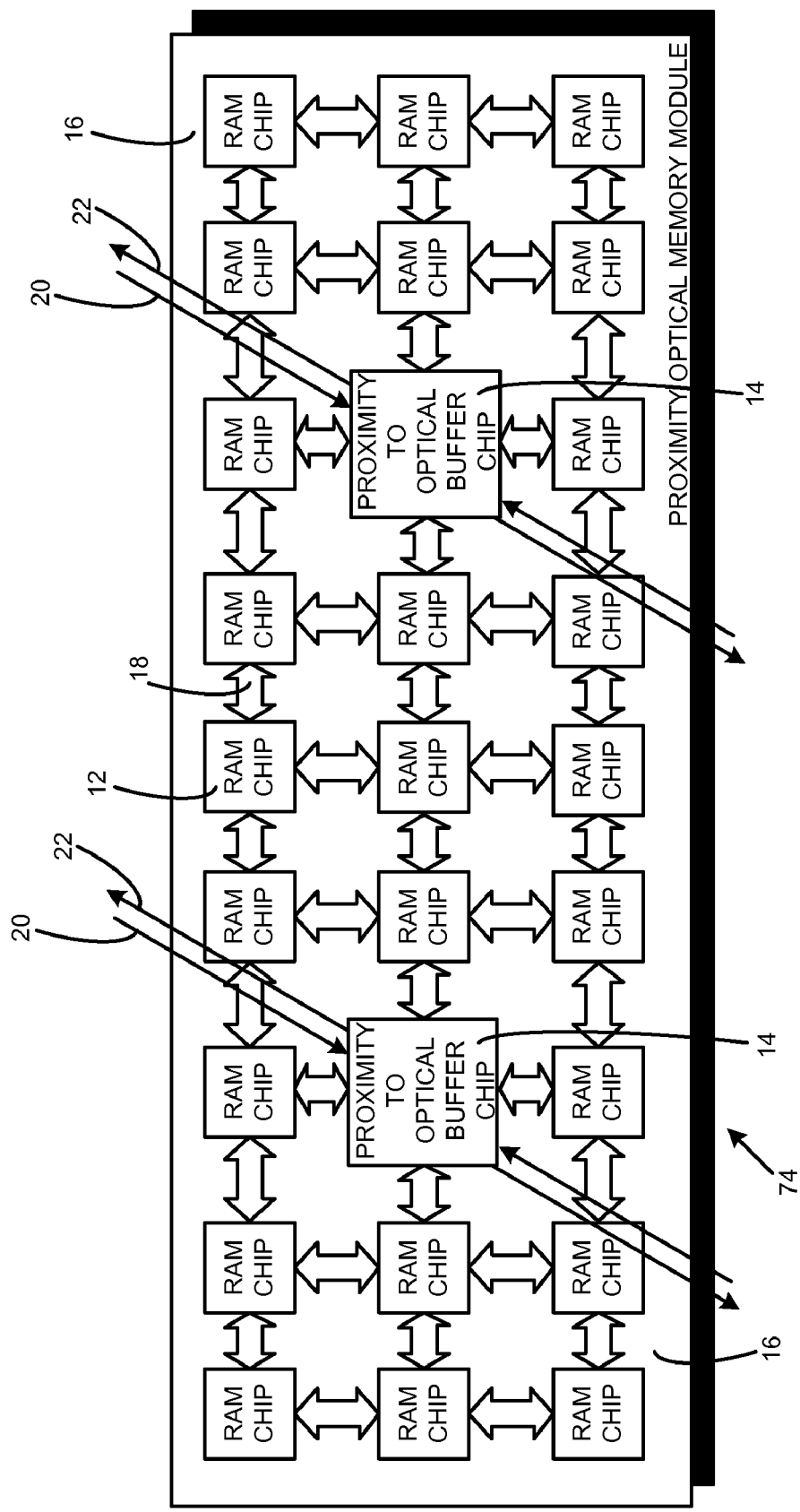
FIG. 9 is a plan circuit diagram of a redundant two-dimensional proximity-to-optical memory module in accordance with an embodiment of the present invention.

Other arrangements may put the optical interface at a position offset from the center position on the substrate or even at either end of the memory array or vector to ease physical packaging. Further, a two-dimensional proximity optical memory module 74 illustrated in the plan view of FIG. 9 includes two interface chips 14 each with its own external optical channels 20, 22 and connected through PxC links 18 to a single network of memory chips 12. Two or more interface chips 14 increase the bandwidth and provide redundancy and fault tolerance against failure of a buffer chip 14. It is possible to remove some of the PxC links 18 such that two separate networks are formed on the substrate 16 around the two proximity-to-optical buffer chips 14.

Figure 10:
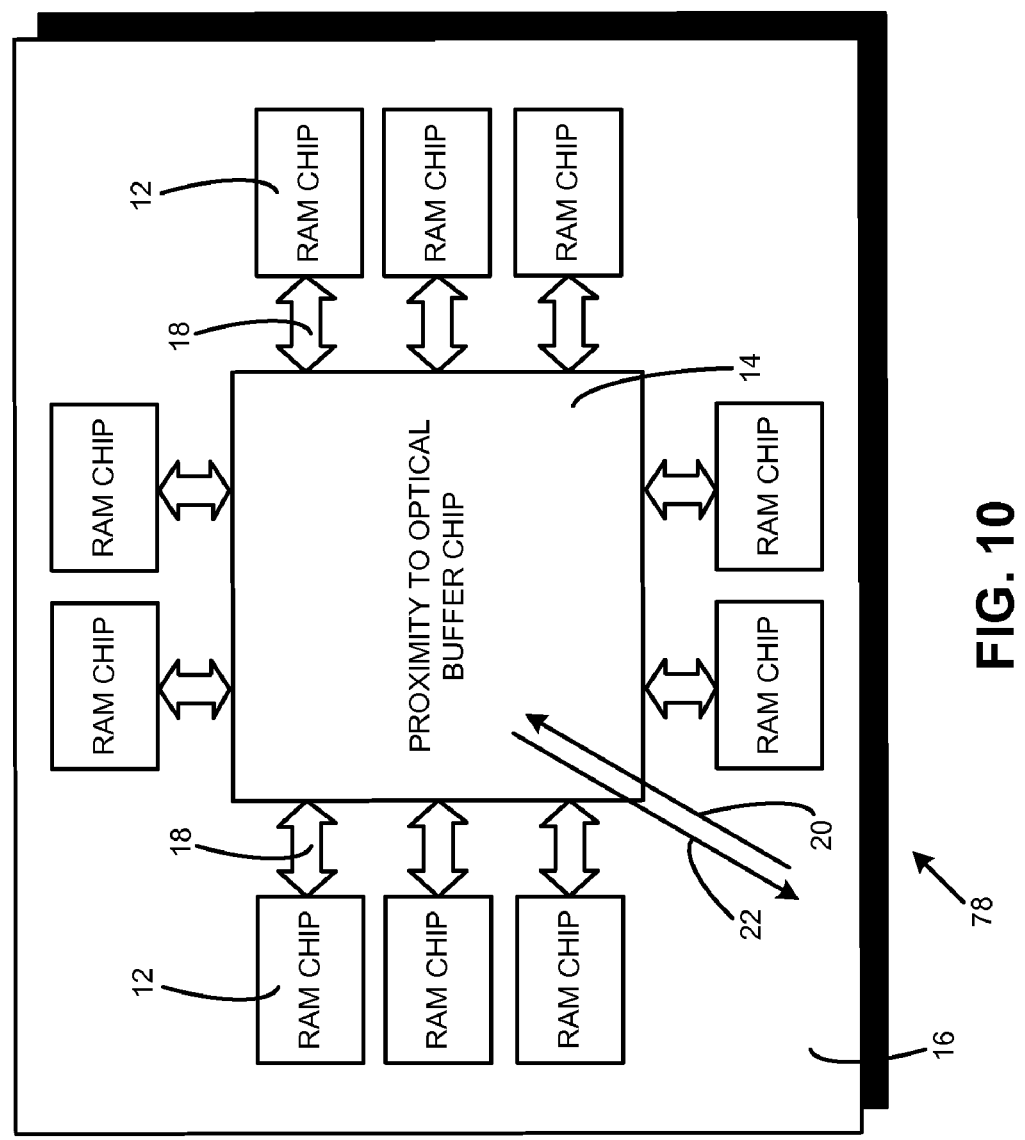
FIG. 10 is a plan circuit diagram of a hub-based proximity-to-optical memory module in accordance with an embodiment of the present invention.

The chip arrangements described thus far assume that intermediate memory chips 12 support bypass channels avoiding the I/O ports on the intermediate memory chip 12 and transport data between other memory chips 12 and the proximity-to-optical buffer 14. In an alternative design, an embodiment of a hub-based memory module 78 illustrated in the plan circuit diagram of FIG. 10 includes a plurality of memory chips 12 on at least one edge of the proximity-to-optical buffer chip 14 and preferably on all four edges through respective PxC links 18. In the illustrated design, all the memory chips 12 immediately surround the proximity-to-optical buffer chip 14 so that the lack of pass-through channels simplifies the design of the memory chips 12.

Figure 11:
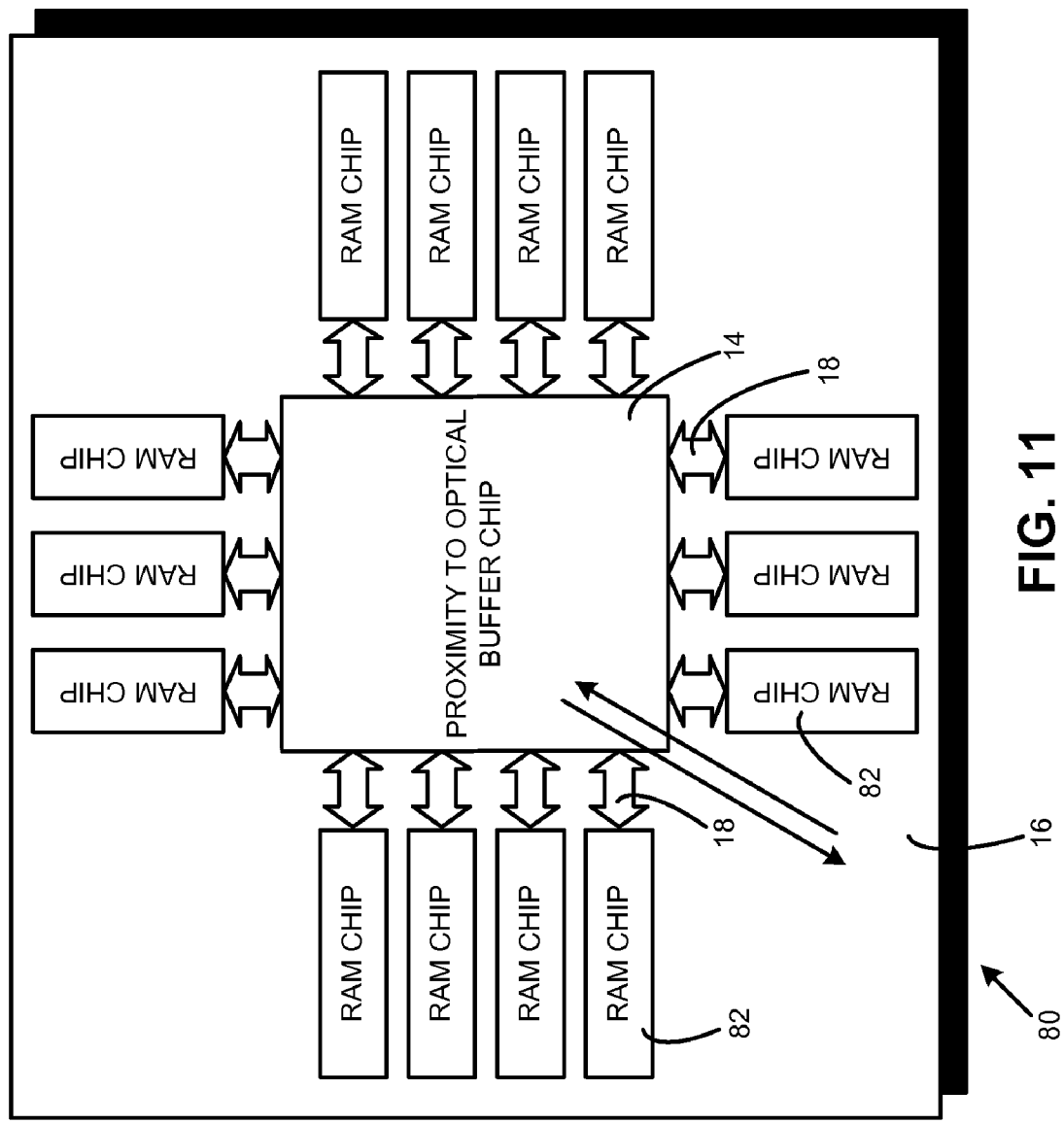
FIG. 11 is a plan circuit diagram of a hub-based proximity-to-optical memory module using elongated memory chips in accordance with another embodiment of the present invention.

Conventional RAM memory chips 12 have a nearly square shape. However, by integrating Proximity Communication onto the RAM chips, it may be advantageous to reformat the RAM chips to have a non-square rectangular aspect ratio and to place the PxC pads along the narrow end. This I/O pad placement leverages the small area requirements of PxC pads and would not be possible with conventional wide I/O buses. Another embodiment of a hub-based memory module 80 illustrated in the plan circuit diagram of FIG. 11 includes elongated memory chips 82 coupled to the proximity-to-optical buffer chip 14. The high aspect ratio of the elongated memory chips 82 allows a larger number of them to be directly connected to the proximity-to-optical buffer chip 14 of fixed size.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A proximity-to-optical memory module, comprising:
   a substrate;
   at least one optical channel;
   an interface chip disposed on the substrate and coupled to the optical channel through an electrical-to-optical and optical-to electrical converter and further including proximity communication transmitting and receiving elements incorporated therein; and
   a plurality of memory chips disposed on the substrate and each including proximity communication transmitting and receiving elements incorporated therein and electrically coupled to proximity communication transmitting and receiving elements of the interface chip to form proximity communication channels.

2. The memory module of claim 1, wherein the proximity communication transmitting and receiving elements comprise metal pads which form respective capacitors when coupled to the pads of an adjacent chip.

3. The memory module of claim 1, wherein the interface chip further comprises an electronic input buffer and an electronic output buffer buffering data between the at least one optical channel and the memory chips.

4. The memory module of claim 1,
   wherein the interface chip and the memory chips have upwardly facing metal pads, and
   further comprising bridge chips having downwardly facing metal pads and sitting atop the interface and memory chips to form proximity communication channels between them.

5. The memory module of claim 1, wherein a plurality of memory chips are arranged in a linear array and wherein proximity communication channels are formed between neighboring ones of the memory chips.

6. The memory module of claim 5,
   wherein the interface chip and the memory chips have upwardly facing metal pads, and
   further comprising bridge chips having downwardly facing metal pads and sitting atop the interface and memory chips to form proximity communication channels between them.

7. The memory module of claim 1, wherein a plurality of memory chips are arranged in a two-dimensional array around the interface chip.

8. The memory module of claim 7, wherein at least some of the memory chips are coupled by proximity communication channels to four neighboring memory chips.

9. The memory module of claim 7, wherein four memory chips are coupled to respective sides of the interface chip through at least four respective proximity communication channels.

10. The memory module of claim 7, including a second interface chip surrounded by a plurality of the memory chips in the two-dimensional array, wherein all the memory chips and the two interface chips are interconnected by a proximity communication network.

11. The memory module of claim 1, wherein a plurality of the memory chips are disposed adjacent to each of a plurality of sides of the interface chip and connected to it through respective proximity communication channels.

12. The memory module of claim 1, wherein the memory chips have a narrow side and a wide side larger than the narrow side and wherein the plurality of the memory chips have their narrow sides disposed adjacent to the sides of the interface chip to form proximity communication channels along the narrow side.

13. A proximity-to-optical memory module, comprising:
   a substrate;
   an interface chip disposed on the substrate and including
      optical couplers for coupling to at least two optical channels;
      an optical-to-electrical converter coupled to one of the optical couplers,
      an electrical-to-optical converter coupled to another of the optical couplers,
      an input buffer electrically coupled to the optical-to-electrical converter,
      an output buffer electrically coupled to the electrical-to-optical converter,
      a set of first pads connected to the input buffer, and
      a set of second pads connected to the output buffer; and
   at least one memory chip each comprising
      a plurality of memory locations,
         a plurality of first pads connected on input paths to the memory locations, and
         a plurality of second pads connected on output paths from the memory locations;
   wherein, when principal surfaces of the memory chip and the interface chip are juxtaposed, the juxtaposed first memory pads are configured to form capacitively coupled links between the interface chip and the memory chip and the juxtaposed second memory pads are configured to form capacitively coupled links between the interface chip and the memory chip.

14. A proximity-to-optical memory module, comprising:
   a substrate;
   an interface chip disposed on the substrate and including
      optical couplers for coupling to at least two optical fibers;
      an optical-to-electrical converter coupled to one of the optical couplers,
      an electrical-to-optical converter coupled to another of the optical couplers, an input buffer electrically coupled to the optical-to-electrical converter, an output buffer electrically coupled to the electrical-to-optical converter, a set of first pads connected to the input buffer, and a set of second pads connected to the output buffer;

at least one memory chip disposed on the substrate and each comprising a plurality of memory locations, a plurality of third pads connected on input paths to the memory locations, and a plurality of fourth pads connected on output paths to the memory locations; and at least one bridge chip disposed on both the interface chip and the memory chip on sides thereof opposite the substrate and including a plurality of fifth pads in corresponding opposition to the first pads and forming capacitively coupled links therebetween, a plurality of sixth pads in corresponding opposition to the second pads and forming capacitively coupled links therebetween, a plurality of seventh pads in corresponding opposition to the third pads and forming capacitively coupled links therebetween, a plurality of eighth pads in corresponding opposition to the fourth pads and forming capacitively coupled links therebetween, and signal channels linking corresponding ones of the fifth and seventh pads and corresponding ones of the sixth and eighth pads, whereby the interface chip and the memory chip are in communication through the bridge chip.

* * * * *